United States Patent
Tsai et al.

(10) Patent No.: US 10,720,677 B2
(45) Date of Patent: Jul. 21, 2020

(54) DISCHARGING CONTROL METHOD FOR BATTERY MODULE AND BATTERY CIRCUIT ARCHITECTURE

(71) Applicant: GETAC TECHNOLOGY CORPORATION, Hsinchu County (TW)

(72) Inventors: Cheng-Han Tsai, Taipei (TW); Ying-Wei Li, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 76 days.

(21) Appl. No.: 16/037,209

(22) Filed: Jul. 17, 2018

(65) Prior Publication Data

US 2019/0190087 A1    Jun. 20, 2019

(30) Foreign Application Priority Data

Dec. 16, 2017    (CN) .......................... 2017 1 1355270

(51) Int. Cl.
| | |
|---|---|
| *H01M 10/44* | (2006.01) |
| *H01M 10/42* | (2006.01) |
| *H01M 10/48* | (2006.01) |
| *G01R 31/382* | (2019.01) |
| *H02J 7/00* | (2006.01) |

(52) U.S. Cl.
CPC ........ *H01M 10/443* (2013.01); *G01R 31/382* (2019.01); *H01M 10/425* (2013.01); *H01M 10/44* (2013.01); *H01M 10/48* (2013.01); *H01M 10/486* (2013.01); *H02J 7/0029* (2013.01); *H01M 2010/4271* (2013.01)

(58) Field of Classification Search
CPC .................................................. H01M 10/443
USPC ....................................................... 320/150
See application file for complete search history.

(56) References Cited

U.S. PATENT DOCUMENTS

| | | | | |
|---|---|---|---|---|
| 6,232,748 B1* | 5/2001 | Kinoshita | ............... | B60K 6/485 320/132 |
| 2011/0031939 A1* | 2/2011 | Funaba | .................. | B60K 6/445 320/166 |

* cited by examiner

*Primary Examiner* — Edward Tso
*Assistant Examiner* — Ahmed H Omar (57) ABSTRACT

A discharging control method for a battery module and a battery circuit architecture are provided. The discharging control method includes: measuring a current remaining power level of the battery module by a power level measuring circuit, detecting a current temperature of the battery module by a temperature detecting circuit, and controlling a discharging circuit by a discharging control circuit in accordance with the current remaining power level and the current temperature of the battery module to discharge the battery module toward a ground end.

20 Claims, 6 Drawing Sheets

DISCHARGING CONTROL METHOD FOR BATTERY MODULE AND BATTERY CIRCUIT ARCHITECTURE

CROSS-REFERENCE TO RELATED APPLICATIONS

This application claims priority from China Patent Application No. 201711355270.4 filed on Dec. 16, 2017, the entire disclosure of which is hereby incorporated by reference.

BACKGROUND OF THE INVENTION

Field of the Invention

The present invention relates to a discharging control method for a battery module and a battery circuit architecture.

Description of the Prior Art

Most electronic devices comprise lithium batteries. Lithium batteries are characterized advantageously by high energy density and thereby effective in supplying power to electronic devices in operation. Furthermore, portable lithium battery-powered electronic devices are designed to function for a long period of time, regardless of whether electrical outlets are available. If the lithium batteries run out of power, users may conveniently charge the lithium batteries to continue the operation of the portable lithium battery-powered electronic devices.

However, lithium batteries pose safety issues. Lithium batteries contain non-aqueous electrolytes. If the electronic devices are stored and/or operated in a high-temperature environment, the non-aqueous electrolytes will decompose, leading to an increase in the pressure inside the lithium batteries. The lithium batteries swell as a result of the increase in the pressure therein. It is dangerous to use, for example, charge, any electronic device with a swollen lithium battery; in a severe scenario, the electronic device burns or even explodes.

SUMMARY OF THE INVENTION

In view of the aforesaid drawbacks of the prior art, it is an objective of the present invention to provide a discharging control method for a battery module and a battery circuit architecture.

In an embodiment, a battery circuit architecture comprises a battery module, a power level measuring circuit, a temperature detecting circuit, a discharging circuit and a discharging control circuit. The battery module comprises a positive end. The power level measuring circuit measures a current remaining power level of the battery module. The temperature detecting circuit detects a current temperature of the battery module. The discharging circuit is coupled between the positive end of the battery module and a ground end. The discharging control circuit receives the current remaining power level and the current temperature of the battery module. The discharging control circuit controls, in accordance with the current remaining power level and the current temperature of the battery module, the discharging circuit to discharge the battery module toward the ground end.

In an embodiment, a discharging control method for a battery module comprises the steps of: measuring a current remaining power level of the battery module by a power level measuring circuit; detecting a current temperature of the battery module by a temperature detecting circuit; and controlling a discharging circuit by a discharging control circuit in accordance with the current remaining power level and the current temperature of the battery module to discharge the battery module toward a ground end. The discharging circuit is coupled between a positive end of the battery module and the ground end.

In conclusion, a discharging control method for a battery module and a battery circuit architecture are provided in accordance with an embodiment of the present invention and characterized by a discharging control circuit for controlling discharge of the battery module in accordance with the current remaining power level and the current temperature of the battery module to prevent the battery module from swelling while an electronic device powered by the battery module is being stored and/or operated in a high-temperature environment.

DETAILED DESCRIPTION OF THE EMBODIMENTS

Figure 1:
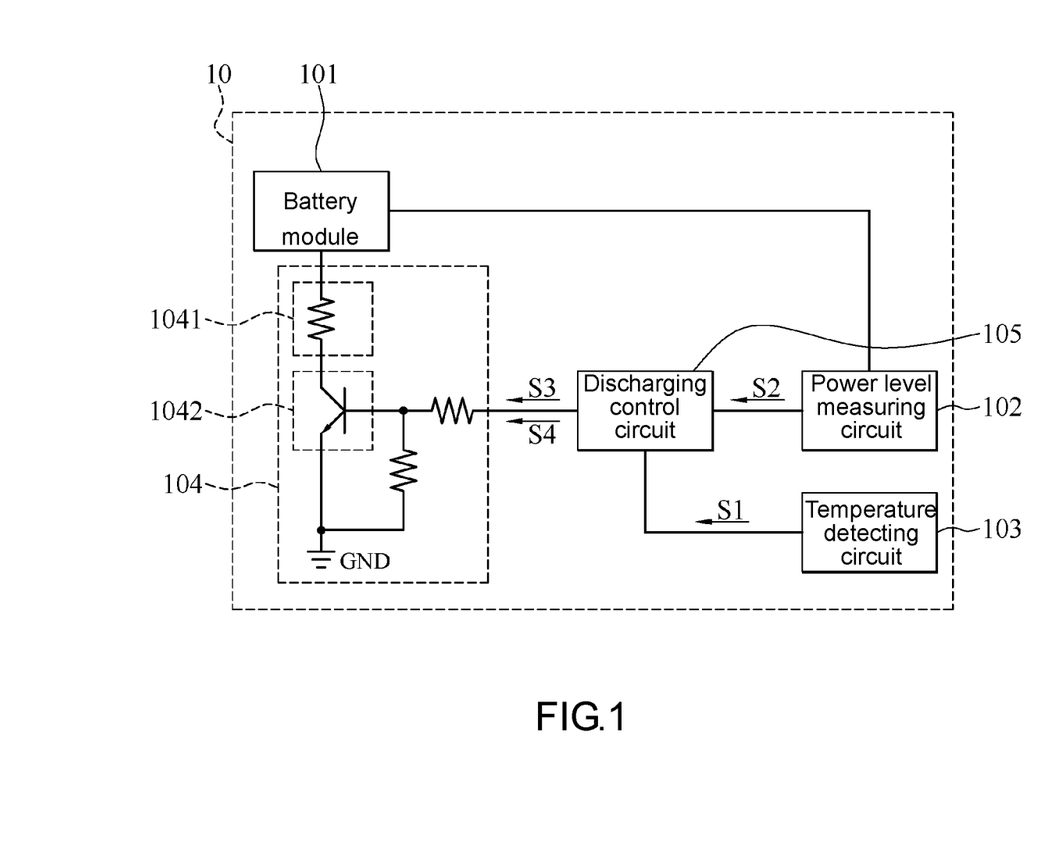
FIG. 1 is a block diagram of a battery circuit architecture in accordance with an embodiment of the present invention.
Figure 2:
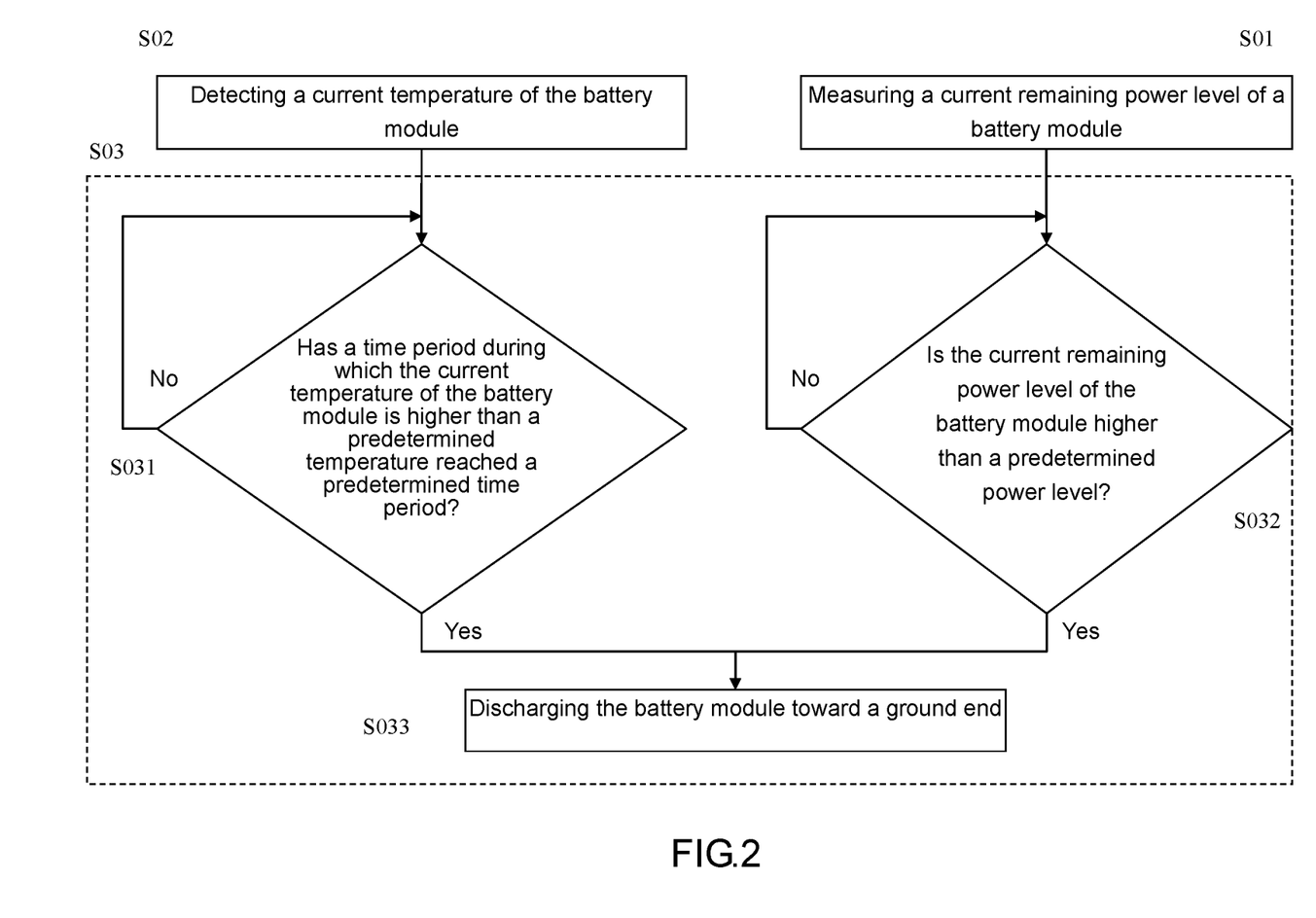
FIG. 2 is a flowchart of a discharging control method for a battery module in accordance with an embodiment of the present invention.

FIG. 1 is a block diagram of a battery circuit architecture in accordance with an embodiment of the present invention. FIG. 2 is a flowchart of a discharging control method for a battery module in accordance with an embodiment of the present invention. Referring to FIG. 1, a battery circuit architecture 10 comprises a battery module 101, a power level measuring circuit 102, a temperature detecting circuit 103, a discharging circuit 104 and a discharging control circuit 105. The power level measuring circuit 102 and the temperature detecting circuit 103 are coupled to the battery module 101. The discharging control circuit 105 is coupled to a control end of the discharging circuit 104, the temperature detecting circuit 103, and the power level measuring circuit 102. The discharging circuit 104 is coupled between the battery module 101 and a ground end GND.

Referring to FIG. 1 and FIG. 2, during its operation, the temperature detecting circuit 103 detects a current temperature S1 of the battery module 101 (step S02). For instance, the temperature detecting circuit 103 indicates at a point in time that the current temperature S1 of the battery module 101 is 40° C. and indicates at another point in time that the current temperature S1 of the battery module 101 is 60° C. The power level measuring circuit 102 measures a current remaining power level S2 of the battery module 101 (step S01). For instance, the power level measuring circuit 102 indicates at a point in time that the current remaining power level S2 of the battery module 101 is 80% and indicates at another point in time that the current remaining power level S2 of the battery module 101 is 20%.

The discharging control circuit 105 receives the current temperature S1 indicated by the temperature detecting circuit 103 and the current remaining power level S2 indicated by the power level measuring circuit 102. Then, the discharging control circuit 105 controls, in accordance with the current temperature S1 and the current remaining power level S2, the discharging circuit 104 to discharge the battery module 101 toward the ground end GND (step S03) and thereby reduce the remaining power level of the battery module 101, so as to prevent the battery module 101 from swelling at high temperature.

In an embodiment, in step S03, the discharging control circuit 105 determines whether to enable the discharging circuit 104 in accordance with the answer to the question "Has a time period during which the current temperature S1 of the battery module 101 is higher than a predetermined temperature reached a predetermined time period?" (step S031) and the answer to the question "Is the current remaining power level S2 of the battery module 101 higher than a predetermined power level?" (step S032). If the discharging control circuit 105 determines that a time period during which the current temperature S1 of the battery module 101 is higher than a predetermined temperature has reached a predetermined time period and that the current remaining power level S2 of the battery module 101 is higher than a predetermined power level, that is, if both the two answers are "yes" in steps S031, S032, the discharging control circuit 105 enables the discharging circuit 104 (step S033), and thus the discharging circuit 104 discharges the battery module 101 toward the ground end GND.

For instance, the predetermined temperature and the predetermined time period are 55° C. and four hours, respectively, whereas the predetermined power level equals 55% of the maximum capacity of the battery module 101. If the discharging control circuit 105 determines that the time period during which the current temperature S1 of the battery module 101 is higher than 55° C. has reached four hours (i.e., the answer is "yes") and the discharging control circuit 105 determines that the current remaining power level S2 of the battery module 101 is higher than 55% of the maximum capacity of the battery module 101 (i.e., the answer is "yes"), the discharging control circuit 105 enables the discharging circuit 104. By contrast, if the discharging control circuit 105 determines that the time period during which the current temperature S1 of the battery module 101 is higher than 55° C. has not reached four hours (i.e., the answer is "no") or the discharging control circuit 105 determines that the current remaining power level S2 of the battery module 101 is lower than or equal to 55% of the maximum capacity of the battery module 101 (i.e., the answer is "no"), the discharging control circuit 105 does not enable the discharging circuit 104. Afterward, the discharging control circuit 105 follows steps S032, S033 repeatedly until both the two answers to the questions in steps S031, S032 are "yes".

Figure 3:
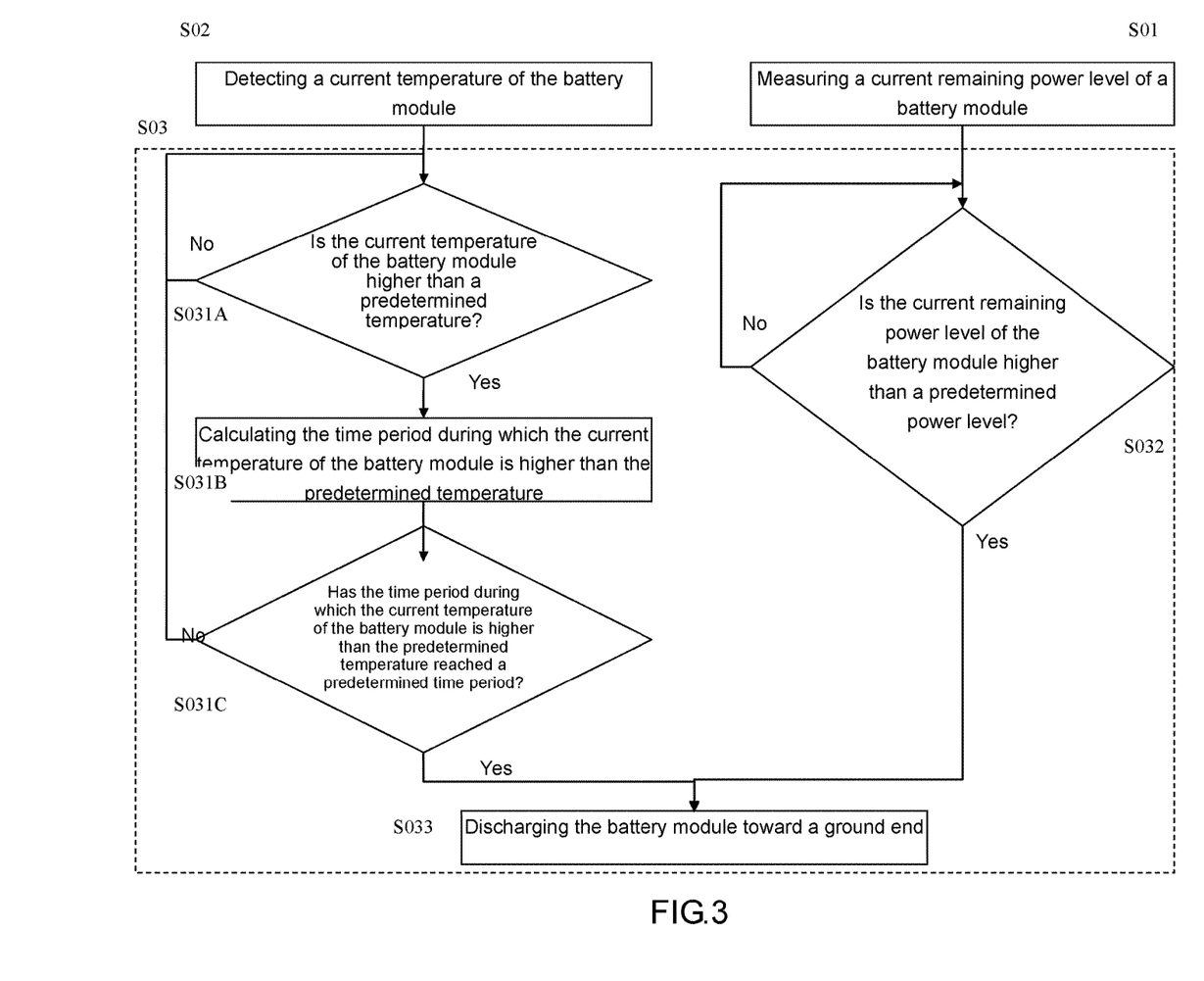
FIG. 3 is a flowchart of an embodiment of one of the steps in FIG. 2.

FIG. 3 is a flowchart of an embodiment of step S031 in FIG. 2. Referring to FIG. 3, in step S031 of an embodiment, the discharging control circuit 105 determines whether the current temperature S1 of the battery module 101 is higher than the predetermined temperature (step S031A). If the current temperature S1 of the battery module 101 is higher than the predetermined temperature, the discharging control circuit 105 further calculates the time period during which the current temperature S1 of the battery module 101 is higher than the predetermined temperature (step S031B). Afterward, the discharging control circuit 105 determines whether the time period during which the current temperature S1 of the battery module 101 is higher than the predetermined temperature has reached the predetermined time period (step S031C). If the answer is "yes", it indicates that the time period during which the current temperature S1 of the battery module 101 is higher than the predetermined temperature has reached the predetermined time period, and thus the discharging control circuit 105 enables the discharging circuit 104 (step S033). If the answers to the questions in steps S031A, S031C are "no", it indicates that the time period during which the current temperature S1 of the battery module 101 is higher than the predetermined temperature has not reached the predetermined time period, and thus the discharging control circuit 105 does not enable the discharging circuit 104.

Figure 4:
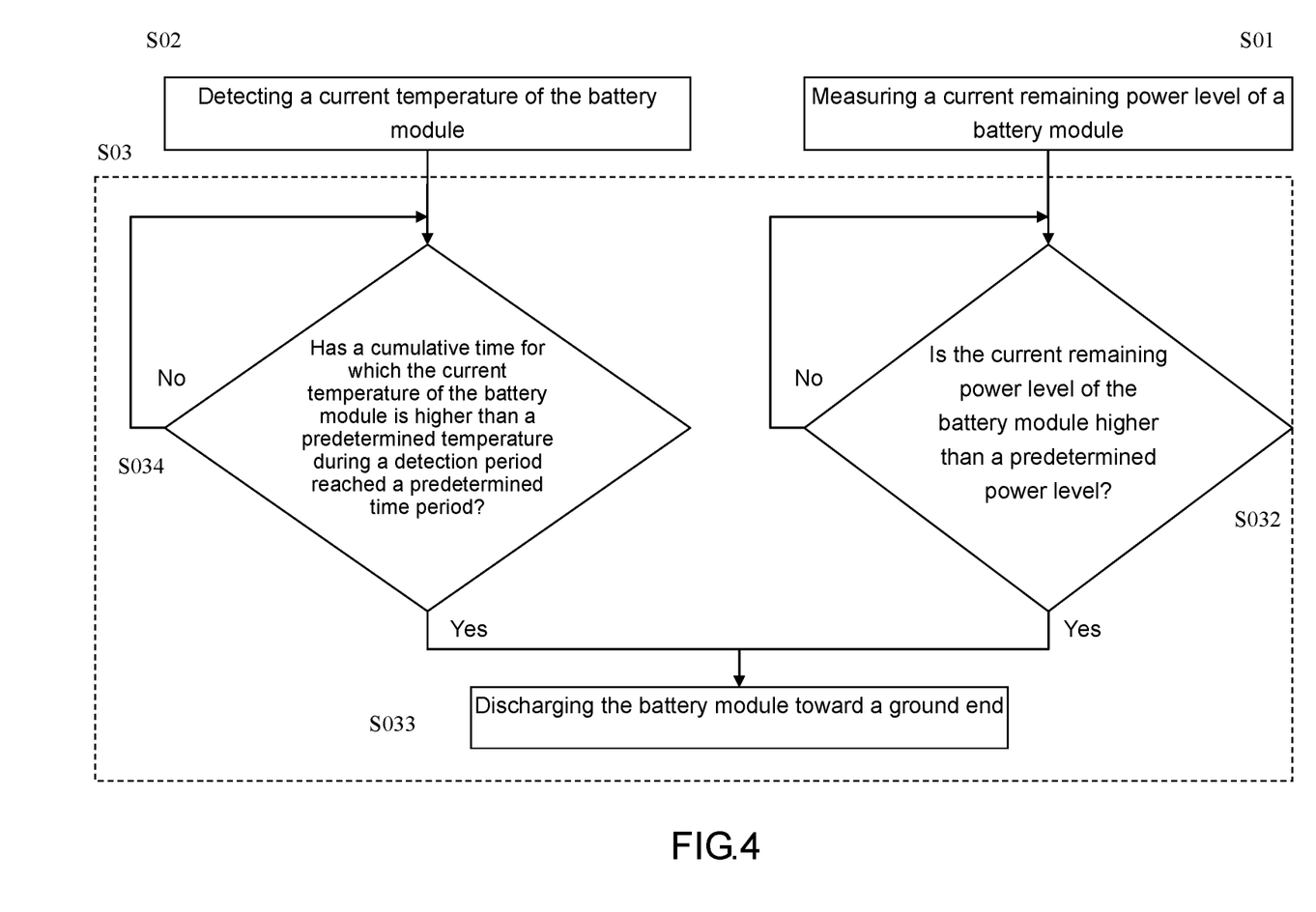
FIG. 4 is a flowchart of the discharging control method for a battery module in accordance with another embodiment of the present invention.

FIG. 4 is a flowchart of the discharging control method for a battery module of FIG. 1 in accordance with another embodiment of the present invention. Referring to FIG. 1 and FIG. 4, in another embodiment, the discharging control circuit 105 performs the step S03 of determining whether a cumulative time for which the current temperature S1 of the battery module 101 is higher than the predetermined temperature during a detection period has reached the predetermined time period (step S034) and determines whether the current remaining power level S2 of the battery module 101 is higher than the predetermined power level, so as to determine whether to enable the discharging circuit 104. In step S034, the discharging control circuit 105 calculates the cumulative time for which the current temperature S1 of the battery module 101 reaches the predetermined temperature during a detection period. If the discharging control circuit 105 determines that the cumulative time reaches the predetermined time period (i.e., the answer is "yes") and determines that the current remaining power level S2 of the battery module 101 is higher than the predetermined power level (i.e., the answer is "yes"), the discharging control circuit 105 enables the discharging circuit 104 (step S033).

The detection period is, for example, six hours. The discharging control circuit 105 determines whether the cumulative time for which the current temperature S1 of the battery module 101 is higher than the predetermined temperature during the six hours' detection period has reached four hours. For example, if, during the six hours' detection period, the current temperature S1 of the battery module 101 reaches 55° C. in the first hour and the second hour, does not reach 55° C. in the third hour, and reaches 55° C. in the fourth hour and the fifth hour, the discharging control circuit 105 determines that the cumulative time for which the current temperature S1 of the battery module 101 is higher than the predetermined temperature during the six hours' detection period has reached four hours (i.e., the answer is "yes"). By contrast, if, during the six hours' detection period, the current temperature S1 of the battery module 101 reaches 55° C. only in the first hour and the sixth hour, the discharging control circuit 105 determines that the cumulative time for which the current temperature S1 of the battery module 101 is higher than the predetermined temperature during the six hours' detection period does not reach the predetermined time period and thus does not enable the discharging circuit 104. The discharging control circuit 105 calculates the cumulative time for which the current temperature S1 of the battery module 101 reaches the predetermined temperature during another detection period.

In an embodiment illustrated by FIG. 1, the discharging circuit 104 comprises a resistor 1041 and a switch transistor 1042. The switch transistor 1042 and the resistor 1041 are series-connected between a positive end of the battery module 101 and the ground end GND. A control end of the switch transistor 1042 is coupled to the discharging control circuit 105. Therefore, when the discharging control circuit 105 follows steps S031, S032 and thereby determines that the time period during which the current temperature S1 of the battery module 101 is higher than the predetermined temperature reaches the predetermined time period and that the current remaining power level S2 of the battery module 101 is higher than the predetermined power level, the discharging control circuit 105 sends an enable signal S3 to the control end of the switch transistor 1042 to therefore control the switch transistor 1042 to turn on. During the time period in which the switch transistor 1042 turns on, the battery module 101 is discharged toward the ground end GND by the resistor 1041. Similarly, when the discharging control circuit 105 follows steps S034, S032 and thereby determines that the cumulative time for which the current temperature S1 of the battery module 101 is higher than the predetermined temperature during the detection period reaches the predetermined time period and that the current remaining power level S2 of the battery module 101 is higher than the predetermined power level, the discharging control circuit 105 sends the enable signal S3 to the control end of the switch transistor 1042 to therefore control the switch transistor 1042 to turn on such that the battery module 101 is discharged toward the ground end GND by the resistor 1041.

In an embodiment, the battery module 101 is a lithium battery or a prismatic battery. The battery module 101 comprises a plurality of battery cells. The power level measuring circuit 102 calculates the total remaining power level of the plurality of battery cells of the battery module 101 in accordance with the remaining power level of every battery cell of the battery module 101, so as to generate the current remaining power level S2.

In an embodiment, the power level measuring circuit 102 still measures the current remaining power level S2 of the battery module 101 while the battery module 101 is being discharged toward the ground end GND and then sends the measured current remaining power level S2 to the discharging control circuit 105. Hence, while the battery module 101 is being discharged, the discharging control circuit 105 determines, in accordance with the current remaining power level S2, whether the current remaining power level S2 of the battery module 101 is lower than or equal to the predetermined power level. If the answer is "yes", the discharging control circuit 105 not only disables the discharging circuit 104 but also sends a disable signal S4 to the control end of the switch transistor 1042 to turn off the switch transistor 1042 and thereby sever a discharging path between the battery module 101 and the ground end GND, so as to stop the discharge of the battery module 101.

In an embodiment, the discharging control circuit 105 is a micro chip or an embedded controller (EC).

In an embodiment, the power level measuring circuit 102 and the temperature detecting circuit 103 are implemented by a gauge IC.

Figure 5:
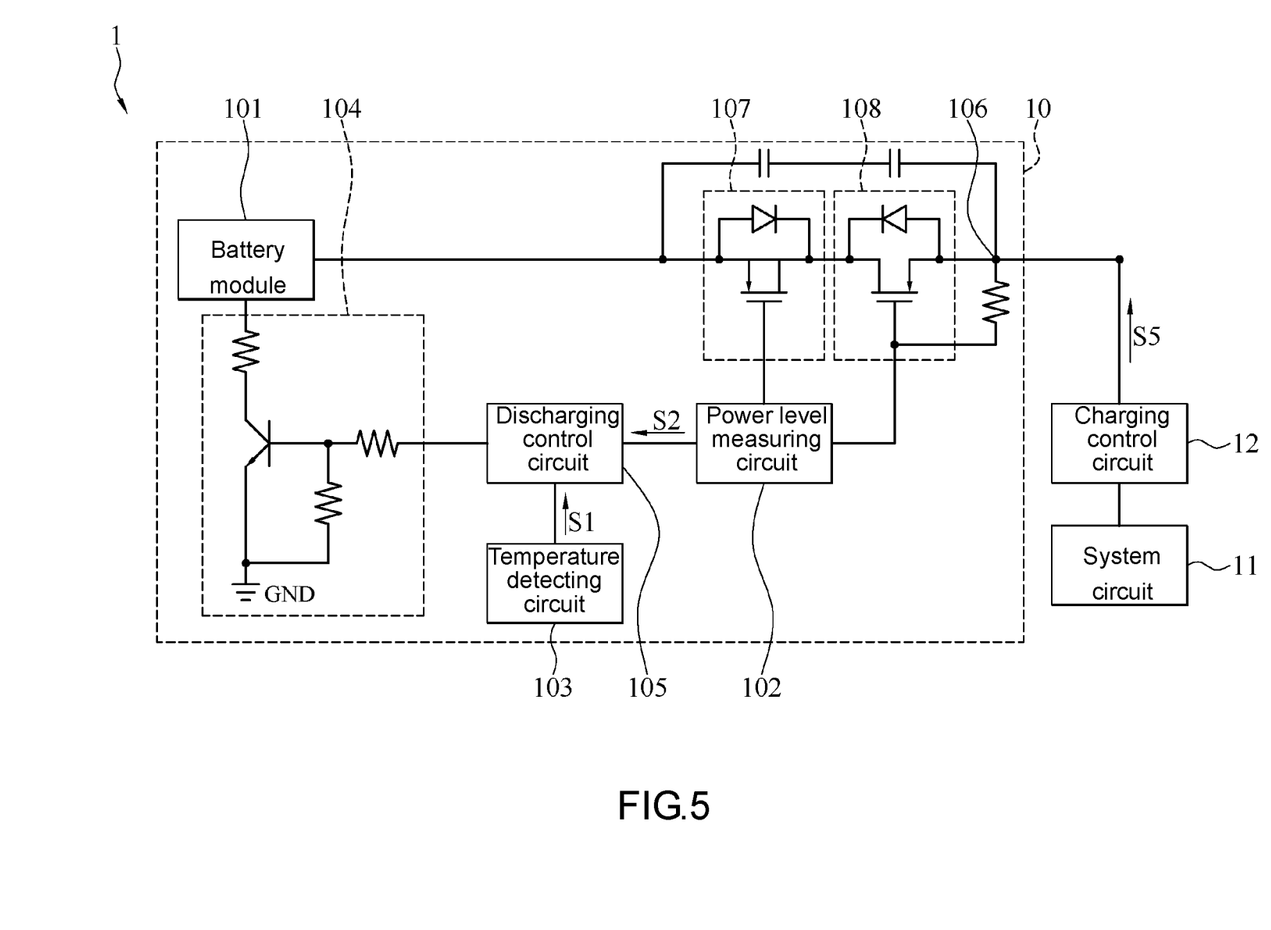
FIG. 5 is a schematic view of a portable electronic device with the battery circuit architecture 10 of FIG. 1 in accordance with an embodiment of the present invention.

FIG. 5 is a schematic view of a portable electronic device 1 with the battery circuit architecture 10 of FIG. 1 in accordance with an embodiment of the present invention. Referring to FIG. 5, the portable electronic device 1 comprises a system circuit 11 and the battery circuit architecture 10 illustrated by FIG. 1. The battery circuit architecture 10 further comprises a power input/output end 106 and a power supply switch 108. The power input/output end 106 is coupled to the system circuit 11 and the power supply switch 108. The power supply switch 108 is coupled between the positive end of the battery module 101 and the power input/output end 106. The power supply switch 108 has a power supply control end. The power supply control end is coupled to the power level measuring circuit 102. The power supply switch 108 operates under the control of the power level measuring circuit 102. The power supply switch 108 creates a power supply path between the battery module 101 and the power input/output end 106. The power level measuring circuit 102 controls the power supply switch 108 to turn on. When the power supply switch 108 turns on, the battery module 101 is discharged toward the power input/output end 106 such that power supplied by the battery module 101 is transmitted to the system circuit 11 through the power input/output end 106, so as to supply operation-required power to the system circuit 11.

Referring to FIG. 5, the portable electronic device 1 further comprises a charging control circuit 12 coupled to the power input/output end 106 of the battery circuit architecture 10, and the battery circuit architecture 10 further comprises a charging switch 107 coupled between the positive end of the battery module 101 and the power input/output end 106. The charging switch 107 has a charging control end which is coupled to the power level measuring circuit 102. The charging switch 107 operates under the control of the power level measuring circuit 102. The charging switch 107 creates a charging path between the power input/output end 106 and the battery module 101. The power level measuring circuit 102 controls the charging switch 107 to turn on. When the charging switch 107 turns on, a power signal S5 received by the power input/output end 106 from the charging control circuit 12 is transmitted from the charging switch 107 to the battery module 101 such that the battery module 101 is charged in accordance with the power signal S5.

Both the charging switch 107 and the power supply switch 108 are coupled between the battery module 101 and the power input/output end 106. The charging switch 107 and the power supply switch 108 are each an n-type transistor. The charging switch 107 and the power supply switch 108 each comprise a diode which is coupled between the drain and the source. When the battery module 101 supplies power to the system circuit 11, the power level measuring circuit 102 controls the power supply switch 108 to turn on for controlling the charging switch 107 to cut off the power. The power supplied by the battery module 101 is transmitted to the power supply switch 108 through the diode of the charging switch 107 and transmitted to the system circuit 11 through the power input/output end 106. When the charging control circuit 12 provides the power signal S5 to the battery module 101, the power level measuring circuit 102 controls the charging switch 107 to turn on for controlling the power supply switch 108 to cut off the power. The power output from the charging control circuit 12 is transmitted to the charging switch 107 through the diode of the power supply switch 108 and transmitted to the battery module 101 through the charging switch 107.

Figure 6:
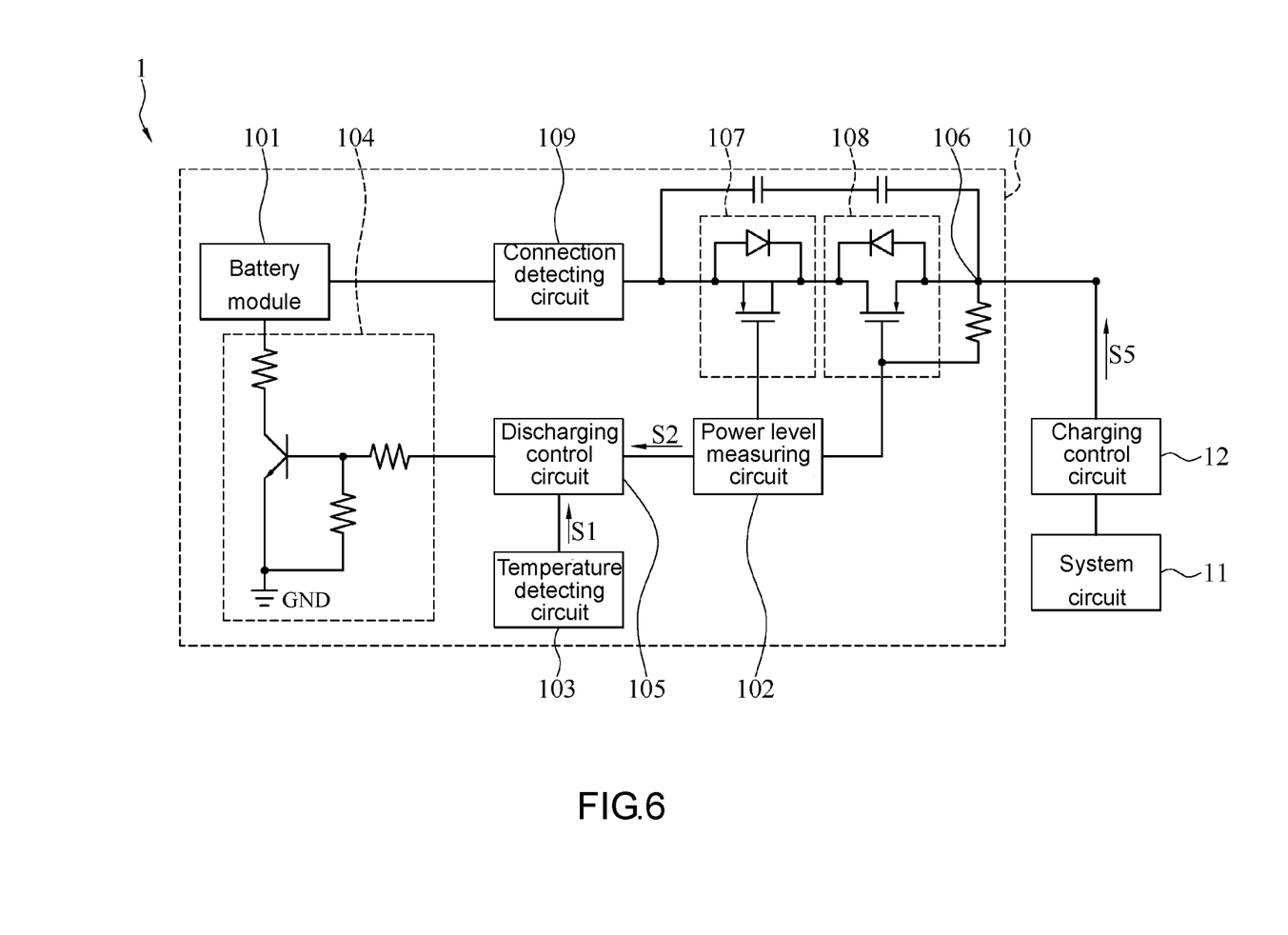
FIG. 6 is a block diagram of the battery circuit architecture in accordance with another embodiment of the present invention.

FIG. 6 is a block diagram of the battery circuit architecture 10 in accordance with another embodiment of the present invention. As shown in FIG. 6, the battery circuit architecture 10 further comprises a connection detecting circuit 109. The connection detecting circuit 109 is coupled to the battery module 101. The connection detecting circuit 109 detects whether the battery module 101 is connected to the portable electronic device 1 and selectively controls (depending on whether the battery module 101 is connected to the portable electronic device 1) the battery module 101 to operate under the control of the discharging control circuit 105 and controls the discharge of the battery module 101 toward the ground end GND by the discharging circuit 104. When the connection detecting circuit 109 detects that the battery module 101 is not connected to the portable electronic device 1, it means that the battery circuit architecture 10 is not mounted in the portable electronic device 1, and thus the connection detecting circuit 109 begins controlling the discharging control circuit 105 to control the discharging circuit 104 to discharge the battery module 101 toward the ground end GND in accordance with the current temperature S1 and the current remaining power level S2. By contrast, when the connection detecting circuit 109 detects that the battery module 101 is connected to the portable electronic device 1, it means that the battery circuit architecture 10 is mounted in the portable electronic device 1, and thus the connection detecting circuit 109 begins controlling another discharging circuit of the portable electronic device 1 to discharge the battery module 101 toward the ground end GND. Therefore, the connection detecting circuit 109 controls a micro chip of the portable electronic device 1 to control another discharging circuit of the portable electronic device 1 to discharge the battery module 101 toward the ground end GND.

In an embodiment, the connection detecting circuit 109 is a micro chip. The connection detecting circuit 109 is coupled between the battery module 101 and the power input/output end 106. The connection detecting circuit 109 determines, according to the voltage level of the power input/output end 106, whether the battery module 101 is connected to the portable electronic device 1, that is, whether the battery module 101 is mounted in the portable electronic device 1.

In conclusion, a discharging control method for a battery module and a battery circuit architecture are provided in accordance with an embodiment of the present invention and characterized by a discharging control circuit for controlling discharge of the battery module in accordance with the current remaining power level and the current temperature of the battery module to prevent the battery module from swelling while an electronic device powered by the battery module is being stored and/or operated in a high-temperature environment.

Although the present invention is disclosed above by embodiments, the embodiments are not restrictive of the present invention. Any persons skilled in the art can make some changes and modifications to the embodiments without departing from the spirit and scope of the present invention. Accordingly, the legal protection for the present invention should be defined by the appended claims.

What is claimed is:

1. A battery circuit architecture, comprising:
a battery module comprising a positive end;
a power level measuring circuit for measuring a current remaining power level of the battery module;
a temperature detecting circuit for detecting a current temperature of the battery module;
a discharging circuit coupled between the positive end and a ground end; and
a discharging control circuit for receiving the current remaining power level and the current temperature and controlling, in accordance with the current remaining power level and the current temperature, the discharging circuit to discharge the battery module toward the ground end;
wherein the discharging control circuit controls the discharging circuit to discharge the battery module when a cumulative time for which the current temperature is higher than a predetermined temperature during a detection period reaches a predetermined time period and the current remaining power level is higher than a predetermined power level, with the detection period being longer than the predetermined time period.

2. The battery circuit architecture of claim 1, wherein the predetermined time period is four hours.

3. The battery circuit architecture of claim 1, wherein the discharging circuit comprises a switch transistor and a resistor, with the switch transistor and the resistor series-connected between the positive end and the ground end, allowing the discharging control circuit to be coupled to a control end of the switch transistor.

4. The battery circuit architecture of claim 1, further comprising:
a power input/output end coupled to a system circuit; and
a power supply switch controlled by the power level measuring circuit and coupled between the positive end and the power input/output end, wherein the battery module is discharged toward the power input/output end when the power supply switch turns on.

5. The battery circuit architecture of claim 4, wherein the power input/output end is coupled to a charging control circuit, and the battery circuit architecture further comprises:
a charging switch controlled by the power level measuring circuit and coupled between the positive end and the power input/output end, wherein, when the charging switch turns on, the battery module is charged through the power input/output end and in accordance with a power signal received by the charging switch from the charging control circuit.

6. The battery circuit architecture of claim 1, further comprising:
a connection detecting circuit for detecting whether the battery module is connected to an electronic device;
wherein, the connection detecting circuit controls the battery module to be operated under control of the discharging control circuit and discharged toward the ground end by the discharging circuit when the battery module is not connected to the electronic device, and the connection detecting circuit controls the battery module to be discharged toward the ground end by another discharging circuit of the electronic device when the battery module is connected to the electronic device.

7. A discharging control method for a battery module, comprising:
measuring a current remaining power level of the battery module by a power level measuring circuit;
detecting a current temperature of the battery module by a temperature detecting circuit; and
controlling a discharging circuit, by a discharging control circuit and in accordance with the current remaining power level and the current temperature, to discharge the battery module toward a ground end, wherein the discharging circuit is coupled between a positive end of the battery module and the ground end;
wherein, in the step of controlling the discharging circuit by the discharging control circuit and in accordance with the current remaining power level and the current temperature, the discharging control circuit controls the discharging circuit to discharge the battery module when a cumulative time for which the current temperature is higher than a predetermined temperature during a detection period reaches a predetermined time period and the current remaining power level is higher than a predetermined power level, with the detection period being longer than the predetermined time period.

8. The discharging control method in accordance with claim 7, wherein the predetermined time period is four hours.

9. The discharging control method in accordance with claim 7, further comprising:
controlling, through the power level measuring circuit, a power supply switch between the positive end of the battery module and a power input/output end to turn on; and
discharging, through the power supply switch, the battery module toward the power input/output end so as to supply power to a system circuit coupled to the power input/output end.

10. The discharging control method in accordance with claim 8, further comprising:
controlling, through the power level measuring circuit, a charging switch between the positive end of the battery module and a power input/output end to turn on; and
charging the battery module through the charging switch according to a power signal received by the power input/output end from a charging control circuit coupled to the power input/output end.

11. The discharging control method in accordance with claim 7, further comprising:
detecting, by a connection detecting circuit, whether the battery module is connected to an electronic device;
wherein, the connection detecting circuit controls the battery module to be operated under control of the discharging control circuit and discharged toward the ground end by the discharging circuit when the battery module is not connected to the electronic device, and the connection detecting circuit controls the battery module to be discharged toward the ground end by another discharging circuit of the electronic device when the battery module is connected to the electronic device.

12. A discharging control method for a battery module, comprising:
measuring a current remaining power level of the battery module by a power level measuring circuit;
detecting a current temperature of the battery module by a temperature detecting circuit; and
controlling a discharging circuit, by a discharging control circuit and in accordance with the current remaining power level and the current temperature, to discharge the battery module toward a ground end, wherein the discharging circuit is coupled between a positive end of the battery module and the ground end;
wherein, in the step of controlling the discharging circuit by the discharging control circuit and in accordance with the current remaining power level and the current temperature, the discharging control circuit controls the discharging circuit to discharge the battery module when a time period during which the current temperature is higher than a predetermined temperature reaches a predetermined time period and the current remaining power level is higher than a predetermined power level.

13. The discharging control method in accordance with claim 12, wherein the step of controlling the discharging circuit by the discharging control circuit and in accordance with the current remaining power level and the current temperature further comprises disabling the discharging circuit by the discharging control circuit when the current remaining power level is lower than or equal to the predetermined power level.

14. The discharging control method in accordance with claim 12, wherein the predetermined time period is four hours.

15. The discharging control method in accordance with claim 14, wherein the predetermined temperature is 55° C.

16. The discharging control method in accordance with claim 12, further comprising:
controlling, through the power level measuring circuit, a power supply switch between the positive end of the battery module and a power input/output end to turn on; and
discharging, through the power supply switch, the battery module toward the power input/output end so as to supply power to a system circuit coupled to the power input/output end.

17. The discharging control method in accordance with claim 16, further comprising:
controlling, through the power level measuring circuit, a charging switch between the positive end of the battery module and a power input/output end to turn on; and
charging the battery module through the charging switch according to a power signal received by the power input/output end from a charging control circuit coupled to the power input/output end.

18. The discharging control method in accordance with claim 12, further comprising:
detecting, by a connection detecting circuit, whether the battery module is connected to an electronic device;
wherein, the connection detecting circuit controls the battery module to be operated under control of the discharging control circuit and discharged toward the ground end by the discharging circuit when the battery module is not connected to the electronic device, and the connection detecting circuit controls the battery module to be discharged toward the ground end by another discharging circuit of the electronic device when the battery module is connected to the electronic device.

19. The battery circuit architecture of claim 2, wherein the predetermined temperature is 55° C.

20. The discharging control method in accordance with claim 8, wherein the predetermined temperature is 55° C.

* * * * *